United States Patent
Rayaprolu et al.

(10) Patent No.: US 10,761,727 B2
(45) Date of Patent: Sep. 1, 2020

(54) SCAN FREQUENCY MODULATION BASED ON MEMORY DENSITY OR BLOCK USAGE

(71) Applicant: Micron Technology, Inc., Boise, ID (US)

(72) Inventors: Vamsi Pavan Rayaprolu, San Jose, CA (US); Sampath K. Ratnam, Boise, ID (US); Harish R. Singidi, Fremont, CA (US); Ashutosh Malshe, Fremont, CA (US); Kishore Kumar Muchherla, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/195,743

(22) Filed: Nov. 19, 2018

(65) Prior Publication Data

US 2020/0159410 A1    May 21, 2020

(51) Int. Cl.
*G06F 3/06* (2006.01)

(52) U.S. Cl.
CPC .......... *G06F 3/0604* (2013.01); *G06F 3/0655* (2013.01); *G06F 3/0679* (2013.01)

(58) Field of Classification Search
None
See application file for complete search history.

(56) References Cited

U.S. PATENT DOCUMENTS

| | | | | |
|---|---|---|---|---|
| 2009/0327803 A1* | 12/2009 | Fukutomi | ............. | G06F 11/108 714/6.32 |
| 2015/0363105 A1* | 12/2015 | Nakao | ................. | G06F 12/0246 711/103 |
| 2017/0365352 A1* | 12/2017 | Shin | .................... | G06F 12/0246 |

* cited by examiner

*Primary Examiner* — Charles J Choi
(74) *Attorney, Agent, or Firm* — Lowenstein Sandler LLP

(57) ABSTRACT

A region of a memory component is determined to include a type of memory. A frequency to perform an operation on the region of the memory component is determined based on the type of memory. The operation is performed on a memory cell at the region of the memory component at the determined frequency to transition the memory cell from a state associated with an increased error rate for data stored at the memory cell to another state associated with a decreased error rate for the data stored at the memory cell.

20 Claims, 6 Drawing Sheets

500

| MEMORY CELL 505 | | |
|---|---|---|
| TYPE | FREQ. | WRITE OPS. |
| QLC | 100s | 100,000 |

| MEMORY CELL 510 | | |
|---|---|---|
| TYPE | FREQ. | WRITE OPS. |
| QLC | 100s | 50,000 |

| WRITE THRESHOLD 515 |
|---|
| 150,000 |

| MEMORY CELL 505 | | |
|---|---|---|
| TYPE | FREQ. | WRITE OPS. |
| QLC | 80s | 151,000 |

| MEMORY CELL 510 | | |
|---|---|---|
| TYPE | FREQ. | WRITE OPS. |
| QLC | 100s | 75,000 |

| WRITE THRESHOLD 515 |
|---|
| 150,000 |

SCAN FREQUENCY MODULATION BASED ON MEMORY DENSITY OR BLOCK USAGE

TECHNICAL FIELD

Embodiments of the disclosure relate generally to memory sub-systems, and more specifically, relate to scan frequency modulation based on memory density or block usage of a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 5A is an illustration of performing an operation on memory cells of a memory component at a determined frequency based on the type of memory, in accordance with an embodiment of the present disclosure.

FIG. 5B is an illustration of adjusting the frequency for performing an operation based on a number of write operations performed on a memory cell exceeding a write threshold, in accordance with embodiments of the disclosure.

DETAILED DESCRIPTION

Figure 1:
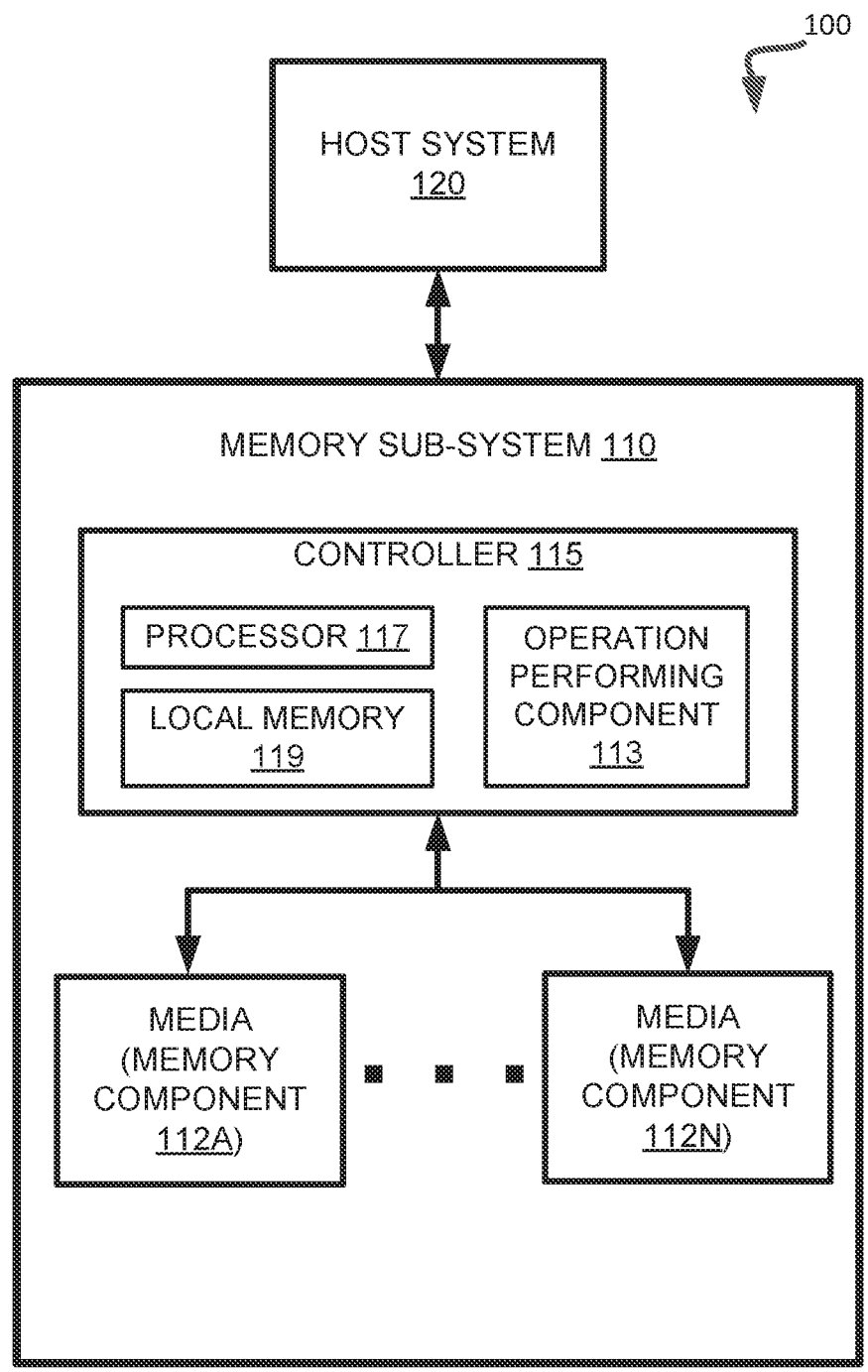
FIG. 1 illustrates an example computing environment that includes a memory sub-system in accordance with some embodiments of the present disclosure.

Aspects of the present disclosure are directed to performing an operation on a memory cell of a memory sub-system at a frequency based on memory type. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

A memory component of a conventional memory sub-system can include memory cells that can store one or more bits of binary data corresponding to data received from the host system. Generally, when an operation (e.g., read, write, or erase operation) is performed on the memory cell, the memory cell can be at a transient threshold voltage ($V_t$) state. In some embodiments, the transient $V_t$ state corresponds to a physical state of the memory cell where electrons are distributed throughout the memory cell. In a conventional memory sub-system, after the operation is performed, the memory cell that can transition to a stable $V_t$ state over time. The stable $V_t$ state can correspond to another physical state of the memory cell where electrons are not distributed throughout the memory cell. Instead, the electrons are more distributed towards the edges or exterior of the memory cell as opposed to being distributed throughout the interior of the memory cell. Data stored on the memory cell while the memory cell is in the stable $V_t$ state can be corrupted or incorrectly stored at the memory cell, resulting in a higher error rate for the data stored at the memory cell. As a result, an increased use of an error detection and correction operation (e.g., an error control operation) can be used on subsequent operations (e.g., read) performed on the memory cell. The increased use of the error control operation can result in a reduction of the performance of the conventional memory sub-system as more resources of the memory sub-system are used to perform the error control operation more frequently instead of performing other read operations or write operations.

The increase in bit flip errors and the amount of time for the memory cells of a memory component to transition from a transient $V_t$ state to a stable $V_t$ state can depend on various factors, such as the amount of data stored at the memory component and the type of memory of the memory component. For example, a type of memory having a higher number of bits of data per memory cell can transition to a stable $V_t$ state more quickly than a memory cell having a lower number of bits of data per memory cell. In another example, memory cells of a memory component storing a large amount of user data can transition to a stable $V_t$ state more quickly than memory cells of a memory component storing a small amount of user data.

Conventional memory sub-systems can perform an operation, such as a read operation, on the memory cells of a memory component at regular intervals to either keep the memory cells in a transient $V_t$ state or to transition the memory cells of the memory component from a stable $V_t$ state to a transient $V_t$ state. However, performing the operation on the memory cells of the memory component at regular intervals results in an excess number of operations being performed on the memory cells of the memory component by the memory sub-system. For example, a conventional memory sub-system can include a memory component having a first region of single-level cells (SLCs) that store one bit of data per cell and a second region of quad-level cells (QLCs) that store four bits of data per cell. The memory sub-system can perform a read operation on the memory cells at a regular interval of 10 seconds. As previously discussed, memory cells having a higher number of bits per cell, such as a QLC, can transition to a stable $V_t$ state more quickly than memory cells having a lower number of bits per cell, such as an SLC. Additionally, the SLCs can have a higher tolerance to being in the stable $V_t$ state as opposed to other memory cells storing a higher number of bits of data (e.g., QLCs). For example, the data stored at SLCs can be more reliably retrieved (e.g., with fewer performed error correction and control operations) when the SLCs are in the stable $V_t$ state as opposed to data that is retrieved from QLCs that are in the stable $V_t$ state. Accordingly, performing the operation on the first region of the memory component having the SLCs at the same interval as the second region of the memory component having QLCs can result in an excess number of operations being performed on the SLCs since the SLCs of the first region can take a longer time to transition to a stable $V_t$ state compared to the QLCs of the second region. The performance of excess operations on the memory cells of the memory component ties up computing resources of the memory sub-system, resulting in a decrease of host system performance and an increased power consumption of the memory sub-system.

Aspects of the present disclosure address the above and other deficiencies by performing an operation on a memory cell of a memory sub-system at a frequency based on memory type so that the memory cell is either kept in a transient $V_t$ state or transitioned to a transient $V_t$ state from a stable $V_t$ state. For example, a type of memory of memory cells in a region of a memory component are determined. Since the amount of time for a memory cell to transition from a transient $V_t$ state to a stable $V_t$ state is dependent on the type of memory, a frequency to perform an operation (e.g., how often the operation is performed) on the memory cells of the memory component is determined based on the type of memory of the memory cells in the region of the memory component. For example, if memory cells in a region of a memory component are a type of memory having a higher number of bits of data per cell, such as QLCs, then the operation can be performed at a higher frequency (e.g., more often) than the frequency of performance of the operation on memory cells of a region of a memory component having a type of memory with a lower number of bits of data per cell, such as SLCs. In an embodiment, the operation transitions the memory cells in the region of the memory component from a state that is associated with an increased error rate for data stored at the memory cell (e.g., a stable $V_t$ state) to an initial state that is associated with a decreased error rate for the data stored at the memory cells (e.g., a transient $V_t$ state). In embodiments, the operation keeps memory cells in the region of the memory component in a state that is associated with a decreased error rate for the data stored at the memory cells (e.g., a transient $V_t$ state). The operation is performed on the memory cells at the determined frequency that is based on the type of memory of the region of the memory component.

In embodiments, the operation can be performed on the memory cells of the region of the memory component until the number of operations exceeds a threshold. For example, if the threshold number of read operations is 100 for a period of time, then 100 operations can be performed on the memory cell during the period of time, after which subsequent operations no longer performed on the memory cell until the period of time has elapsed. The limiting of the number of operations being performed for a period of time can reduce effects of a read disturb of a particular memory cell. Read disturb is the result of continually reading from one memory cell without intervening erase operations causing other nearby memory cells to change over time (e.g., become programmed). Therefore, in order to preserve the data stored at nearby memory cells and reduce the effects of read disturb, subsequent read operations are not performed after the threshold number of read operations have been performed on the memory cell within the period of time.

In embodiments, the frequency to perform the operation on memory cells of the region of the memory component can be determined based on the amount of data stored at the region of the memory component. For example, the operation can be performed at a higher frequency (e.g., more often) for a region having a large amount of data stored at the region than a region having a small amount of data stored at the region.

Advantages of the present disclosure include, but are not limited to, an increased reliability of data stored at the memory sub-system. For example, memory cells of a memory sub-system can be kept in a transient $V_t$ state as opposed to the stable $V_t$ state, resulting in a reduced error rate associated with data stored at the memory cell. Thus, the data stored on the memory cells can use fewer error control operations when retrieving the data. Furthermore, by performing the operation on the memory cells of a region at a frequency that is based on the type of memory and/or the amount of data stored at the region, the number of excess operations performed on the memory cells is reduced, resulting in an improvement of performance of the memory sub-system and a decrease in power consumption by the memory sub-system. Although embodiments are described using memory cells (e.g., SLCs, MLCs, TLCs and QLCs) of a NAND flash memory, aspects of the present disclosure can be applied to other types of memory components.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory sub-system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an operation performing component 113 that can be used to perform an operation on a memory cell of a memory sub-system at a frequency based on memory type. In some embodiments, the controller 115 includes at least a portion of the operation performing component 113. For example, the controller 115 can include a processor 117 (processing device) configured to execute instructions stored in local memory 119 for performing the operations described herein. In some embodiments, the operation performing component 113 is part of the host system 110, an application, or an operating system.

The operation performing component 113 can determine a type of memory of a region of a memory component (e.g., memory components 112A-N). The operation performing component 113 can determine a frequency to perform an operation on the region of the memory component based on the type of memory. The operation performing component 113 can further perform the operation on a memory cell at the region of the memory component at the determined frequency. The operation performing component 113 can determine an amount of data stored at a memory component. The operation performing component 113 can determine a frequency to perform an operation on one or more memory cells of the memory component based on the amount of data stored at the memory component. Further details with regards to the operations of the operation performing component 113 are described below.

Figure 2:
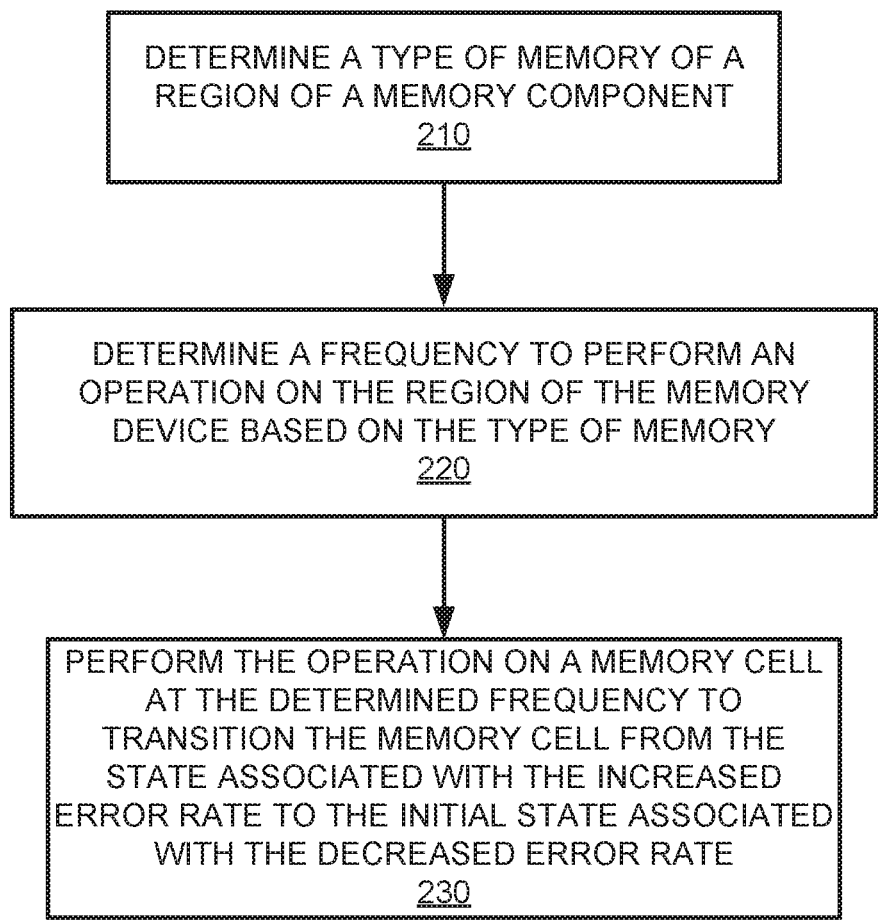
FIG. 2 is a flow diagram of an example method to perform an operation on a memory cell at a region of a memory component at a frequency that is based on a type of memory associated with the region in accordance with some embodiments of the present disclosure.

FIG. 2 is a flow diagram of an example method 200 to perform an operation on a memory cell at a region of a memory component at a frequency that is based on a type of memory associated with the region, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the operation performing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, a processing device determines a type of memory of a region of a memory component. The region of the memory is a portion of the memory component that includes a particular type of memory cell. For example, the portion of the memory component can be a part of the memory component that includes memory cells that store a particular number of bits per memory cell (e.g., SLCs, MLCs, TLCs, or QLCs). The memory component can include multiple regions where each of the regions is a different portion of the memory component. For example, a first region can be a portion of the memory component that includes SLC-based memory and a second region can be another portion of the memory component that includes QLC-based memory. Thus, the type of memory can correspond to a number of bits of data stored per memory cell of the region of the memory component. In some embodiments, the processing device determines the type of memory by retrieving a data structure that specifies the type of memory cell at each region of the memory component. In the same or alternative embodiments, the data structure is stored at or accessible by a controller of a memory sub-system that includes the memory component.

At block 220, the processing device determines a frequency to perform an operation on the region of the memory component based on the type of memory. As previously described, the operation can be a read operation. In some embodiments, the operation can be any operation that applies a voltage to a memory cell.

As previously discussed, the frequency to perform the operation can be based on the number of bits of data stored per memory cell at the region of the memory component. For example, the operation can be performed at a higher frequency (e.g., more often) for a region including QLCs, which store 4 bits of data per memory cell, than for a region including SLCs, which store 1 bit of data per memory cell. Thus, the frequency can be higher for memory cells with a higher number of bits of data that can be stored at the memory cells while the frequency can be lower for memory cells with a lower number of bits of data that can be stored at each of the memory cells. Thus, for a memory component that includes a first region of SLCs, a second region of TLCs, and a third region of QLCs, a first frequency value can be used to perform the operation at the first region of SLCs and a second frequency value can be used to perform the operation at the second region of TLCs. The second frequency value can be higher than the first frequency value. A third frequency value can be used to perform the operation at the third region of QLCs where the third frequency value is higher than both the first frequency value and the second frequency value. Thus, the frequency values can be based on the number of bits per memory cell of a particular region (e.g., more bits per cell results in a higher frequency value). The processing device can determine the frequency by retrieving a data structure that specifies particular frequency values for each type of region of the memory components of the memory sub-system. For example, the data structure can be maintained by the controller and can be accessed when performing the operations to the regions of the memory component.

In some embodiments, the frequency to perform the operation can also be determined based on a data retention time and/or a transition time to the state with the increased error rate associated with the type of memory. For example, the frequency can be based on a combination of the type of memory and the data retention time or the transition time. The data retention time can be represented by an amount of time that data can be reliably stored at a memory cell of a memory component while the memory component is in a powered off state. The data retention time can be specified or defined in a data structure by a controller of the memory sub-system. For example, the data retention time can be predefined for each type of memory. In some embodiments, the data retention time can be determined based on observations of the behavior of the memory sub-system. For example, the data retention time can be based on an observation of how frequently error correction operations are performed on data stored at the different regions of the memory component. The data retention time can be an amount of time that elapses before a threshold number of error correction operations are performed for data stored at memory cells. The frequency can be increased if the data retention time is observed to have decreased.

In an embodiment, the data retention time can include a safety factor to ensure the integrity of data stored at the memory component. For example, if a memory component can store data reliably in a power off state for 6 months and the safety factor is two, then the data retention time for the memory component can be 3 months (e.g., 6 months divided by two). The safety factor can be a predefined value stored at a data structure that specifies the safety factor for the memory component or can specify different safety factors for different regions of the memory component.

The transition time from the state with the decreased error rate to the state with the increased error rate can be represented by an amount of time that can elapse for a memory cell of a memory component to transition from an initial state associated with a decreased error rate (e.g., transient $V_t$ state) to a state with an increased error rate (e.g., stable $V_t$ state). The transition time is a physical property of the memory cells of a particular type of memory. The transition time can be defined in a data structure that is accessed by the controller of the memory sub-system. Thus, the data structure can identify different known transition times for each different type of memory used in the memory component. For example, a first transition time can be specified for SLCs, a second transition time can be specified for TLCs, and a third transition time can be specified for QLCs where each of the respective transition times can be different and are specified based on known physical properties of the respective memory cells.

In some embodiments, the data retention time and/or transition time can serve as upper or lower bounds for the frequency to perform the operation. For example, the operation can be performed at a frequency that is greater than the data retention time associated with the type of memory and less than the transition time associated with the type of memory.

At block 230, the processing device performs the operation on a memory cell at the determined frequency to transition the memory cell from the state associated with the increased error rate to the initial state associated with the decreased error rate.

In an embodiment, the operation can be a read operation performed on the memory cell. The memory type can be, for example, a QLC-based memory and the corresponding determined frequency can be, for example, 100 seconds. Another type of memory type can be TLC-based memory and the corresponding determined frequency can be 1000 seconds (e.g., less frequent than the QLC-based memory). A read operation can include multiple steps or processes such as applying a voltage to a word line that includes a particular memory cell and performing a voltage or current sensing step at the particular memory cell. The read operation can further include error detection and correction operations and return data from the particular memory cell to a controller. In embodiments, the operation can be a reset read operation performed on the memory cell. The reset read operation can include fewer steps or processes than the read operation. For example, the reset read operation can apply the voltage to the word line that includes the particular memory cell without performing additional steps or processes such as the sensing of a current, error detection and correction operations, or returning any data to the controller.

In some embodiments, a reset read operation can be used when performing operations to transition memory cells from the stable $V_t$ state to the transient $V_t$ state or to maintain memory cells in the transient $V_t$ state. A read operation can include multiple steps or processes in addition to applying a voltage to a word line and/or a memory cell. In contrast, the reset read operation can include fewer steps or processes than the read operation. For example, the reset read operation can apply the voltage to the word line that includes the particular memory cell without performing additional steps or processes such as the sensing of a current, error detection and correction operations, or returning any data to the controller.

In embodiments, the operation can be performed on memory cells of different regions of memory components of the memory sub-system at different frequencies. For example, a memory component can include a first region having SLCs and a second region having TLCs. The operation can be performed on the first region having SLCs at a first frequency and the second region having TLCs at a second frequency. Since the number of bits per cell for the first region having SLCs is lower than the number of bits per cell for the second region having TLCs, the first frequency to perform the operation can be lower (e.g., performed less often) than the second frequency.

Figure 3:
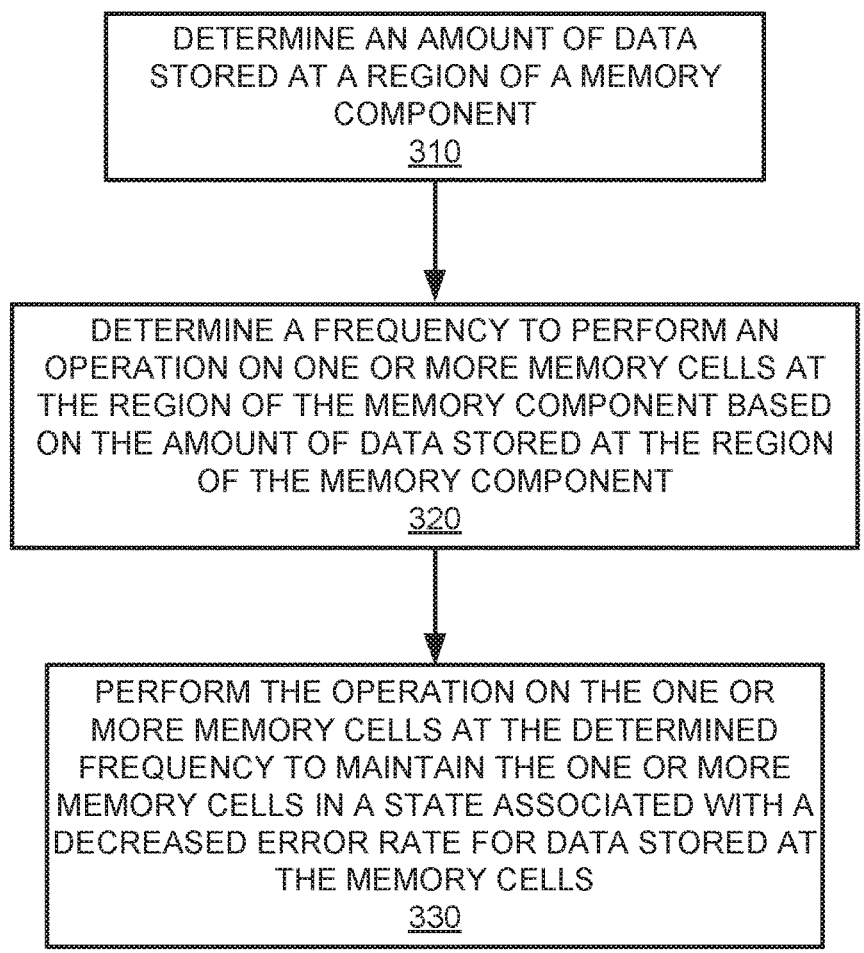
FIG. 3 is a flow diagram of an example method to perform an operation on one or more memory cells of a memory component at a frequency that is based on the amount of data stored at the memory component in accordance with some embodiments of the present disclosure.

FIG. 3 is a flow diagram of an example method 300 to perform an operation on one or more memory cells of a memory component at a frequency that is based on the amount of data stored at the memory component, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the operation performing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, a processing device determines an amount of data stored at a region of a memory component. The data stored at the region of the memory component can correspond to user data received from a host system and stored at one or more memory cells of the region of the memory component. In embodiments, the amount of data can correspond to a number of bits of data stored at the region of the memory component. In an embodiment, the amount of data can correspond to a number of memory cells of the region that are storing the user data. The processing device determines the amount of data by maintaining a data structure that identifies the available storage capacity and utilization of each region of the memory component. For example, as data is stored at or erased from different regions of the memory component, the available storage capacity and the utilization of each region can be updated to reflect the data that has been stored or erased from the respective region.

At block 320, the processing device determines a frequency to perform an operation on one or more memory cells at the region of the memory component based on the amount of data stored at the region of the memory component. In embodiments, the frequency to perform the operation can be based on the number of bits of data stored at the region of the memory component. For example, the operation can be performed at a higher frequency (e.g., more often) for a region storing a larger amount of data than for a region storing a smaller amount of data. In an embodiment, the frequency to perform the operation can be based on the number of memory cells at the region that are storing user data. For example, the operation can be performed at a higher frequency for a region with 200 memory cells storing user data than for a region with 100 memory cells storing user data.

At block 330, processing device performs the operation on the one or more memory cells at the region of the memory component at the determined frequency. In an embodiment, the operation is performed on the one or more memory cells at the region of the memory component to maintain the memory cell in the initial state associated with the decreased error rate for the data stored at the one or more memory cells. The decreased error rate of the initial state (e.g., transient $V_t$ state) is relative to the increased error rate for data stored at the one or more memory cells for another state (e.g., steady $V_t$ state.) In embodiments, the operation can transition the one or more memory cells from the state associated with the increased error rate for the data stored at the memory cell to the initial state associated with the decreased error rate for the data stored at the memory cell at the determined frequency.

In an embodiment, the operation can be a read operation performed on the memory cell. The operation can be performed on memory cells at the region of the memory component that are storing user data, while the operation is not performed on memory cells at the region that do not store user data. For example, if a region of the memory component includes 400 memory cells and 300 of the memory cells are storing user data and 100 of the memory cells are not storing user data, then the operation can be performed on the 300 memory cells that are storing user data.

Figure 4:
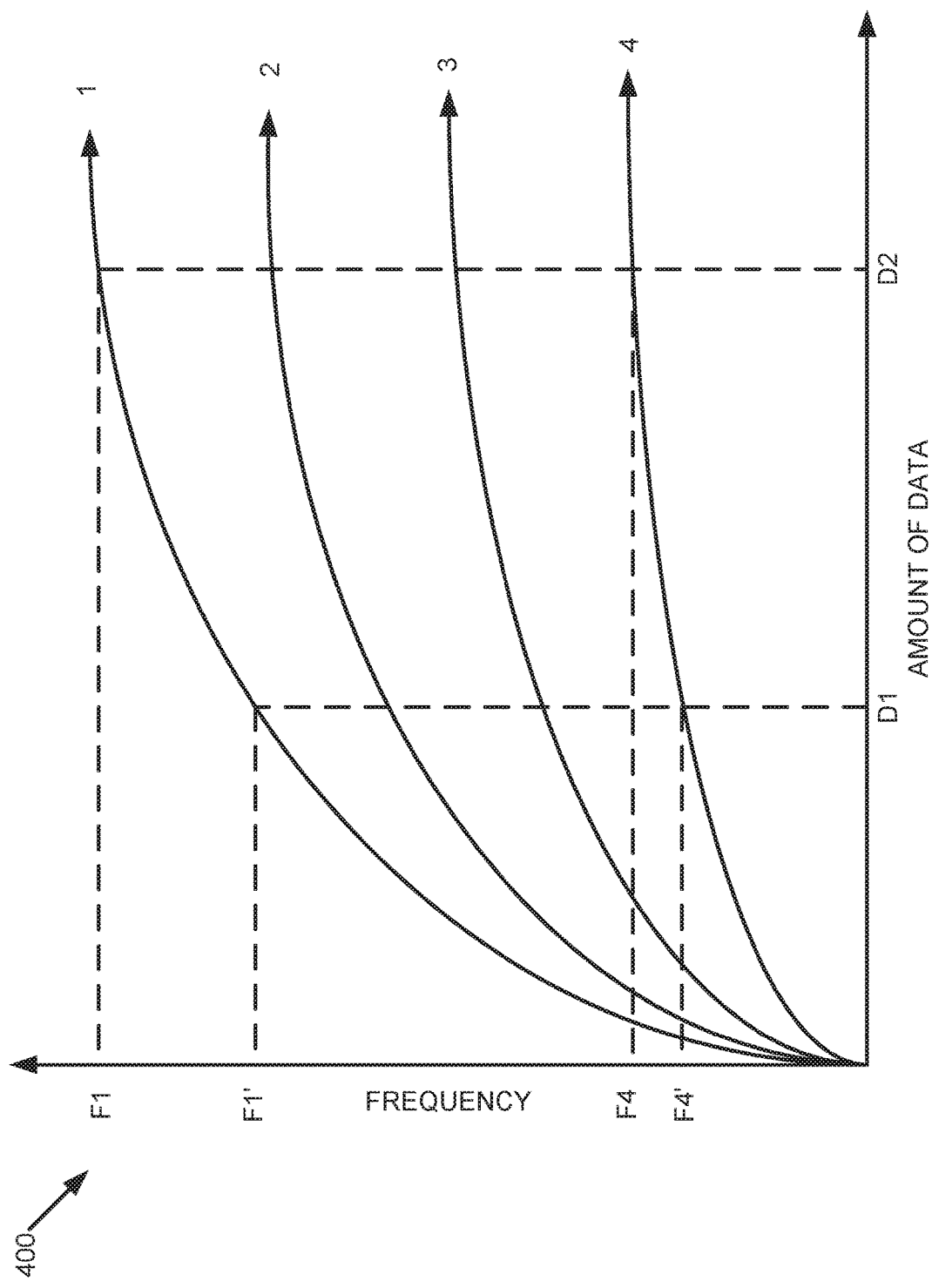
FIG. 4 illustrates a graph of an example of determining a frequency to perform an operation based on a type of memory and amount of data stored at the memory in accordance with some embodiments of the present disclosure.

FIG. 4 illustrates a graph 400 of an example of determining a frequency to perform an operation based on a type of memory and amount of data stored at the memory, in accordance with some embodiments of the present disclosure. The graph 400 includes a y-axis that corresponds to a frequency for performance of an operation on a region of a memory component and an x-axis that corresponds to an amount of data stored at the region of the memory component. The graph 400 further includes lines 1-4, where each of the lines 1-4 is representative of a different type of memory. For example, line 1 can represent a QLC memory, line 2 can represent a TLC memory, line 3 can represent an MLC memory, and line 4 can represent an SLC memory.

Lines 1-4 can represent a determined frequency to perform an operation on the memory cells of a region of a memory component based on the type of memory and/or the amount of data stored at the memory. For example, if a region of a memory component includes SLC memory (e.g., line 4) and stores an amount of data D2, then the determined frequency to perform the operation on the memory cells of the region is frequency F4. If the amount of data stored at the region of the memory component decreases to amount of data D1, then the determined frequency to perform the operation is decreased to frequency F4' so that the operation is performed less often.

In another example, if the amount of data D2 stored at the region stays the same, but the type of memory is changed from an SLC memory to a QLC memory (e.g., from line 4 to line 1), then the determined frequency to perform the operation is increased to frequency F1 so that the operation is performed more often. The type of memory for a region can be changed based on the number of bits of data programmed to each of the memory cells of the region. For example, the memory cells of the region can initially be programmed as SLC, where the memory cells each store one bit of user data. On a subsequent programming operation, the memory cells of the region can be programmed as QLC, where the memory cells each store four bits of user data. Although embodiments describe a type of memory changing from an SLC to a QLC memory, in embodiments the type of memory can change from any type of memory to another type of memory.

If the amount of data stored at a region that includes QLC memory is decreased from amount of data D2 to amount of data D1, then the determined frequency to perform the operation is decreased from frequency F1 to frequency F1' so that the operation is performed less often.

FIG. 5A is an illustration 500 of performing an operation on memory cells of a memory component at a determined frequency based on the type of memory, in accordance with an embodiment of the present disclosure. Illustration 500 includes memory cell 505, memory cell 510 and write threshold 515. Memory cell 505 and memory cell 510 have corresponding types of memory (e.g., TYPE), determined frequencies for performing an operation (e.g., FREQ.) and a number of write operations performed on the memory cell (e.g., WRITE OPS.)

When data is written to a memory cell of a memory component, the memory cell can be damaged. Therefore, as the number of write operations performed on a memory cell increases, the transition time of the memory cell and the data retention time of the memory cell decreases. Accordingly, the operation can be performed more frequently on a memory cell having a higher number of write operations than a memory cell having a lower number of write operations performed on the memory cell. The write threshold 515 can correspond to a number of write operations performed on a particular memory cell. When the number of write operations performed on a memory cell exceeds the write threshold 515 of 150,000 write operations, the frequency at which the operation is performed on the memory cell can be adjusted.

In illustration 500, memory cell 505 is a QLC type of memory and the number of write operations performed on memory cell 505 is 100,000 write operations. Memory cell 510 is a QLC type of memory and the number of write operations performed on memory cell 510 is 50,000 write operations. Since memory cell 505 and memory cell 510 are the same type of memory (e.g., QLC) and the number of write operations for both memory cell 505 (e.g., 100,000 write operations) and memory cell 510 (e.g., 50,000 write operations) do not exceed the write threshold 515, the operation can be performed on memory cell 505 and memory cell 510 at the same frequency of 100 seconds.

FIG. 5B is an illustration 550 of adjusting the frequency for performing an operation based on a number of write operations performed on a memory cell exceeding a write threshold, in accordance with embodiments of the disclosure. In illustration 550, the number of write operations performed on memory cell 505 has increased to 151,000 write operations and the number of write operations performed on memory cell 510 has increased to 75,000 write operations. Since the number of write operations performed on memory cell 505 exceeds write threshold 515, the frequency at which the operation is performed on memory cell 505 can be adjusted from 100 seconds to 80 seconds. Since the number of write operations performed on memory cell 510 does not exceed write threshold 515, the frequency at which the operation is performed on memory cell 510 remains at 100 seconds.

Figure 6:
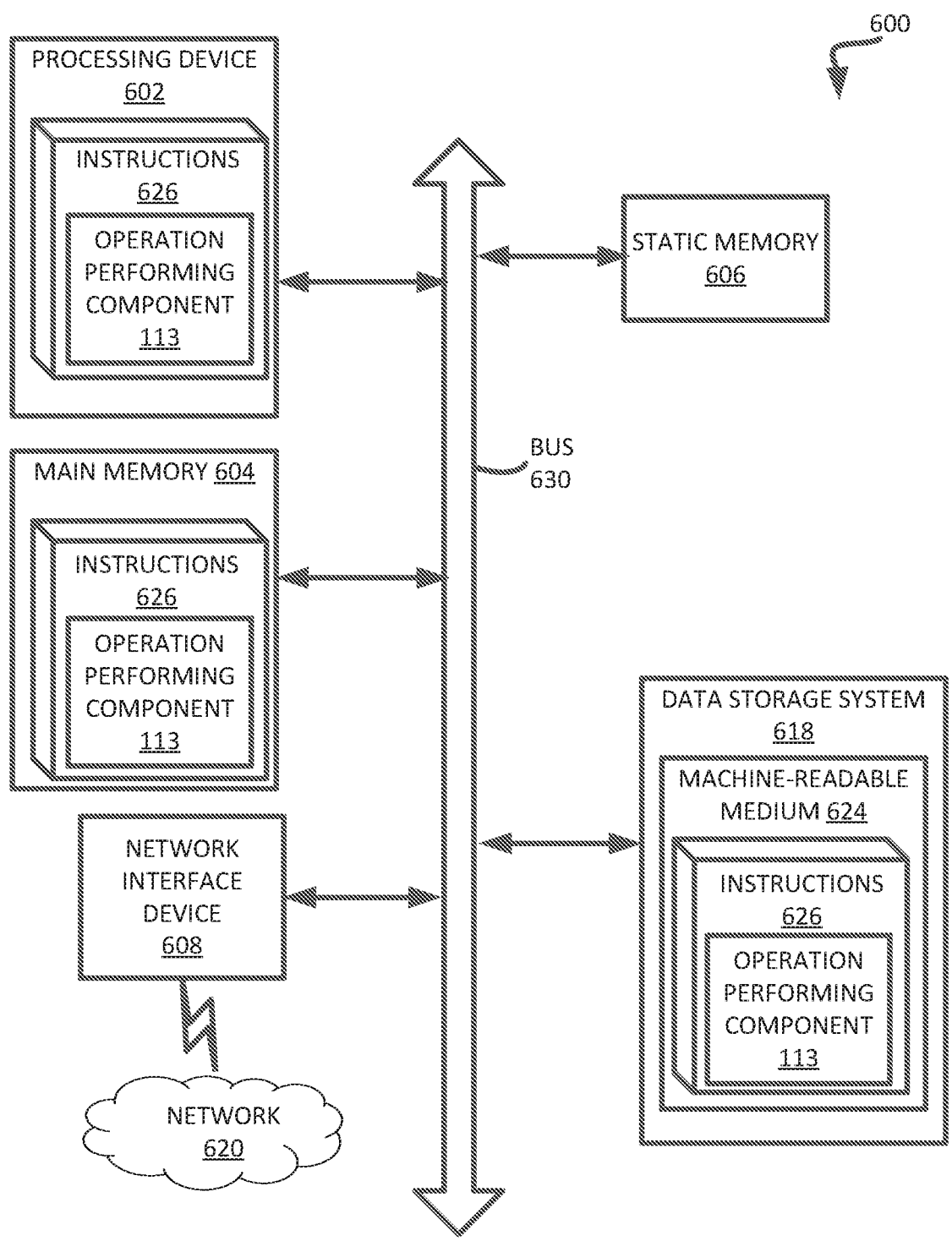
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the operation performing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an operation performing component (e.g., the operation performing component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory component; and a processing device, operatively coupled with the memory component, to:

determine a first amount of data stored at a region of the memory component that comprises a type of memory;
determine a first frequency to perform an operation on the region of the memory component based on the first amount of data;
determine a second amount of data stored at the region of the memory component that comprises the type of memory;
determine a second frequency to perform the operation on the region of the memory component based on the second amount of data, the second frequency being lower than the first frequency; and
perform the operation on a memory cell at the region of the memory component at the second frequency to transition the memory cell at the region of the memory component from a state associated with an increased error rate for data stored at the memory cell to another state associated with a decreased error rate for the data stored at the memory cell.

2. The system of claim 1, wherein the another state associated with the decreased error rate for the data stored at the memory cell corresponds to a transient threshold voltage state, and the state associated with the increased error rate for the data stored at the memory cell corresponds to a stable threshold voltage state.

3. The system of claim 1, wherein the operation is a read operation.

4. The system of claim 1, wherein the processing device is further to:
determine that a third amount of data is stored at a second region of the memory component that comprises a second type of memory;
determine a third frequency to perform the operation on the second region of the memory component based on the second amount of data and the second type of memory; and
perform the operation on a memory cell at the second region of the memory component at the third frequency.

5. The system of claim 1, wherein the processing device is further to:
determine a number of write operations that have been performed on the memory cell at the region of the memory component;
in response to determining that the number of write operations performed on the memory cell exceeds a threshold, adjust the second frequency to perform a subsequent operation on the region of the memory component; and
perform a subsequent operation on the memory cell at the region of the memory component at the adjusted second frequency.

6. The system of claim 1, wherein to determine the second frequency to perform the operation on the region of the memory component based on the second amount of data, the processing device is to determine a data retention time and a transition time to the state with the increased error rate of the memory cell, wherein determining the second frequency to perform the operation on the region of the memory component is further based on the data retention time and the transition time to the state associated with the increased error rate of the memory cell.

7. The system of claim 1, wherein to determine the second amount of data stored at the region of the memory component, the processing device is further to determine a number of bits of the data that are stored in the region of the memory component.

8. A method comprising:
determining an amount of data stored at a memory component, wherein determining the amount of data comprises determining a percentage utilization of an available storage capacity of the memory component;
determining a frequency to perform an operation on one or more memory cells of the memory component based on the amount of data stored at the memory component; and
performing, by a processing device, the operation on the one or more memory cells of the memory component at the determined frequency to maintain the one or more memory cells of the memory component in a state associated with a decreased error rate for data stored at the one or more memory cells, wherein the decreased error rate is relative to another state associated with an increased error rate for the data stored at the one or more memory cells.

9. The method of claim 8, wherein the state associated with the decreased error rate for the data stored at the memory cell corresponds to a transient threshold voltage state.

10. The method of claim 8, wherein the operation corresponds to a read operation of the one or more memory cells.

11. The method of claim 8, wherein the determined frequency is decreased for a lower amount of data stored at the memory component than when a higher amount of data is stored at the memory component.

12. The method of claim 8, further comprising:
determining a number of write operations performed on the one or more memory cells of the memory component;
in response to determining that the number of write operations performed on the one or more memory cells of the memory component exceeds a threshold, adjusting the determined frequency to perform a subsequent operation on the one or more memory cells of the memory component; and
performing the subsequent operation on the one or more memory cells of the memory component at the adjusted frequency.

13. The method of claim 8, further comprising:
determining that the amount of data stored at the memory component has changed;
determining a second frequency to perform a subsequent operation on the one or more memory cells of the memory component based on the changed amount of data stored at the memory component; and
performing the subsequent operation on the one or more memory cells of the memory component at the determined second frequency.

14. The method of claim 13, wherein the frequency is a first frequency, and wherein determining the amount of data stored at the memory component has changed comprises:
determining the amount of data stored at a region of the memory component that comprises a type of memory;
determining the first frequency to perform an operation on the region of the memory component based on the amount of data and the type of memory;
determining the changed amount of data stored at the region of the memory component that comprises the type of memory; and
determining the second frequency to perform the operation on the region of the memory component based on the changed amount of data, the second frequency being lower than the first frequency.

15. A non-transitory computer-readable storage medium comprising instructions that, when executed by a processing device, cause the processing device to:
- determine a first amount of data stored at a region of a memory component that comprises a type of memory;
- determine a first frequency to perform an operation on the region of the memory component based on the first amount of data;
- determine a second amount of data stored at the region of the memory component that comprises the type of memory;
- determine a second frequency to perform the operation on the region of the memory component based on the second amount of data, the second frequency being greater than the first frequency; and
- perform the operation on a memory cell at the region of the memory component at the second frequency to transition the memory cell at the region of the memory component from a state associated with an increased error rate for data stored at the memory cell to another state associated with a decreased error rate for the data stored at the memory cell.

16. The non-transitory computer-readable storage medium of claim 15, wherein the another state associated with the decreased error rate for the data stored at the memory cell corresponds to a transient threshold voltage state, and the state associated with the increased error rate for the data stored at the memory cell corresponds to a stable threshold voltage state.

17. The non-transitory computer-readable storage medium of claim 15, wherein the operation is a read operation.

18. The non-transitory computer-readable storage medium of claim 15, wherein the processing device is further to:
- determine that a third amount of data is stored at a second region of the memory component that comprises a second type of memory;
- determine a third frequency to perform the operation on the second region of the memory component based on the second amount of data and the second type of memory; and
- perform the operation on a memory cell at the second region of the memory component at the third frequency.

19. The non-transitory computer-readable storage medium of claim 15, wherein the processing device is further to:
- determine a number of write operations that have been performed on the memory cell at the region of the memory component;
- in response to determining that the number of write operations performed on the memory cell exceeds a threshold, adjust the second frequency to perform a subsequent operation on the region of the memory component; and
- perform a subsequent operation on the memory cell at the region of the memory component at the adjusted second frequency.

20. The non-transitory computer-readable storage medium of claim 15, wherein to determine the second frequency to perform the operation on the region of the memory component based on the second amount of data, the processing device is to determine a data retention time and a transition time to the state with the increased error rate of the memory cell, wherein determining the second frequency to perform the operation on the region of the memory component is further based on the data retention time and the transition time to the state with the increased error rate of the memory cell.

* * * * *